United States Patent
Wang et al.

(10) Patent No.: US 8,418,985 B2
(45) Date of Patent: *Apr. 16, 2013

(54) ELECTRONIC DEVICE FRAME AND SUPPORT MECHANISM UTILIZED THEREBY

(75) Inventors: Wei-Jun Wang, Shenzhen (CN); Zi-Ming Tang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 445 days.

This patent is subject to a terminal disclaimer.

(21) Appl. No.: 12/560,522

(22) Filed: Sep. 16, 2009

(65) Prior Publication Data

US 2011/0006647 A1  Jan. 13, 2011

(30) Foreign Application Priority Data

Jul. 9, 2009 (CN) .......................... 2009 1 0304183

(51) Int. Cl.
*F16M 11/24* (2006.01)
*F16M 13/00* (2006.01)
*H05K 5/00* (2006.01)

(52) U.S. Cl.
USPC .... 248/602; 248/188.2; 248/917; 361/679.01

(58) Field of Classification Search ............. 248/220.21, 248/220.22, 222.13
See application file for complete search history.

(56) References Cited

U.S. PATENT DOCUMENTS

| | | | |
|---|---|---|---|
| 4,458,872 A * | 7/1984 | Couch | 248/497 |
| 4,858,865 A * | 8/1989 | Schrepfer | 248/188.2 |
| 7,328,879 B1 * | 2/2008 | Plangetis | 248/679 |
| 7,986,512 B2 * | 7/2011 | Tang | 361/679.01 |
| 2003/0081996 A1 * | 5/2003 | Sun et al. | 403/381 |
| 2005/0127260 A1 * | 6/2005 | Dittmer | 248/221.11 |
| 2008/0055830 A1 * | 3/2008 | Tseng et al. | 361/681 |

* cited by examiner

*Primary Examiner* — Jonathan Liu
*Assistant Examiner* — Erin W Smith
(74) *Attorney, Agent, or Firm* — Altis Law Group, Inc.

(57) ABSTRACT

An electronic device frame includes a housing, a positioning member connecting with the housing, and an inner supporting mechanism. The inner supporting mechanism includes a support member fixed on the housing, a slider slidably connected to the support member, and a fastener connecting the support member to the slider. One of the slider and the supporting member defines a locking slot, in which the fastener is locked. The fastener can lock in any position along the locking slot, such that the slider can maintain different positions and resist the positioning member by moving relative to the supporting member.

6 Claims, 5 Drawing Sheets

ELECTRONIC DEVICE FRAME AND SUPPORT MECHANISM UTILIZED THEREBY

BACKGROUND

1. Technical Field

The present disclosure relates generally to electronic devices and, more particularly, to an electronic device frame with an adjustable support mechanism and the support mechanism utilized thereby.

2. Description of Related Art

An electronic device, such as a flat panel display, often has a back housing and a front bezel positioned on the back housing. If the size and thinness of the flat panel display are increased, a middle portion of the front bezel is easily bent, requiring that the flat panel display utilize an inner support mechanism to support the front bezel.

A frequently used support mechanism of the flat panel display includes two support bases and a plurality of support bars. The support bases are fixed on opposite ends of the back housing, and the support bars are horizontally positioned on the support bases and abut the front bezel. However, the typical support mechanism has a complex structure, and a height thereof cannot be changed.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
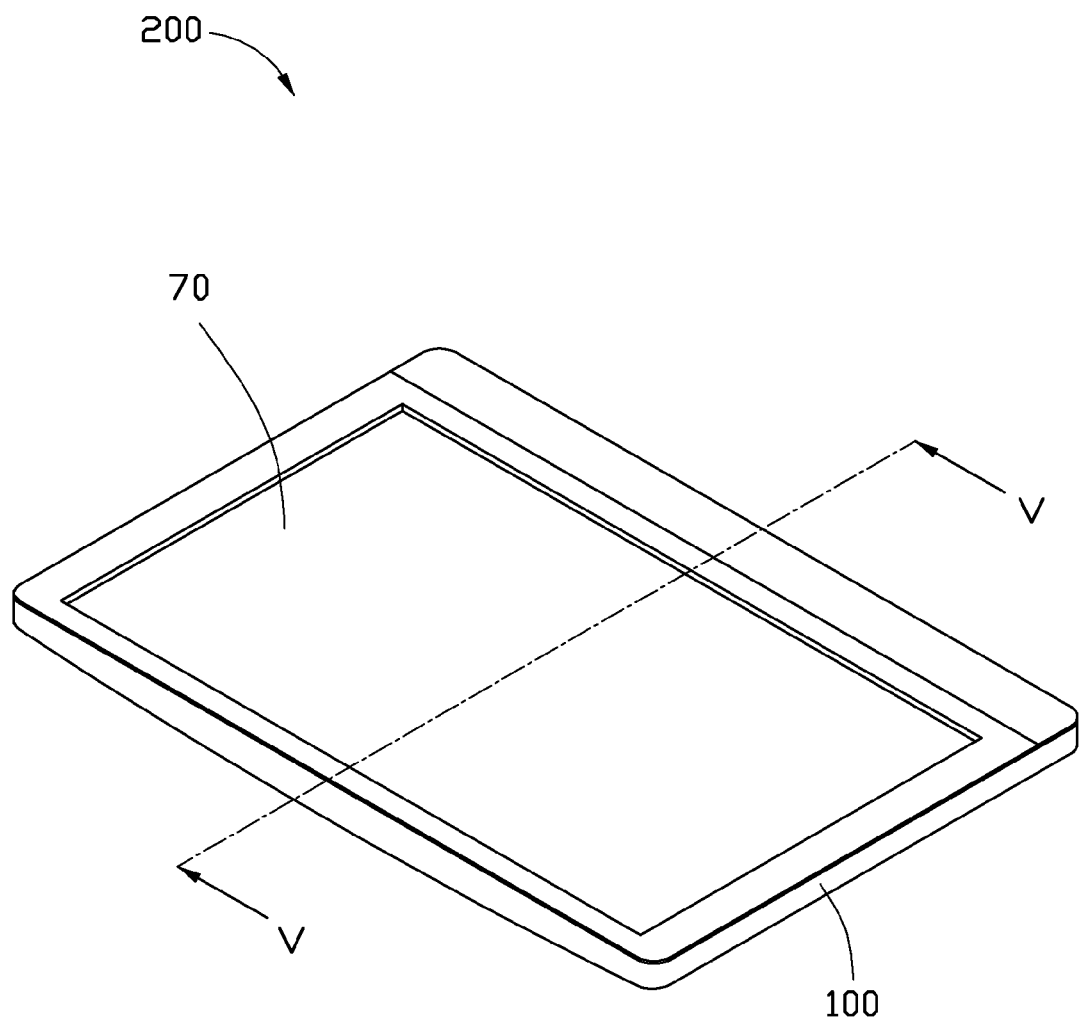
FIG. 1 is an isometric view of one embodiment of an electronic device frame applied in a display body of an electronic device.
Figure 2:
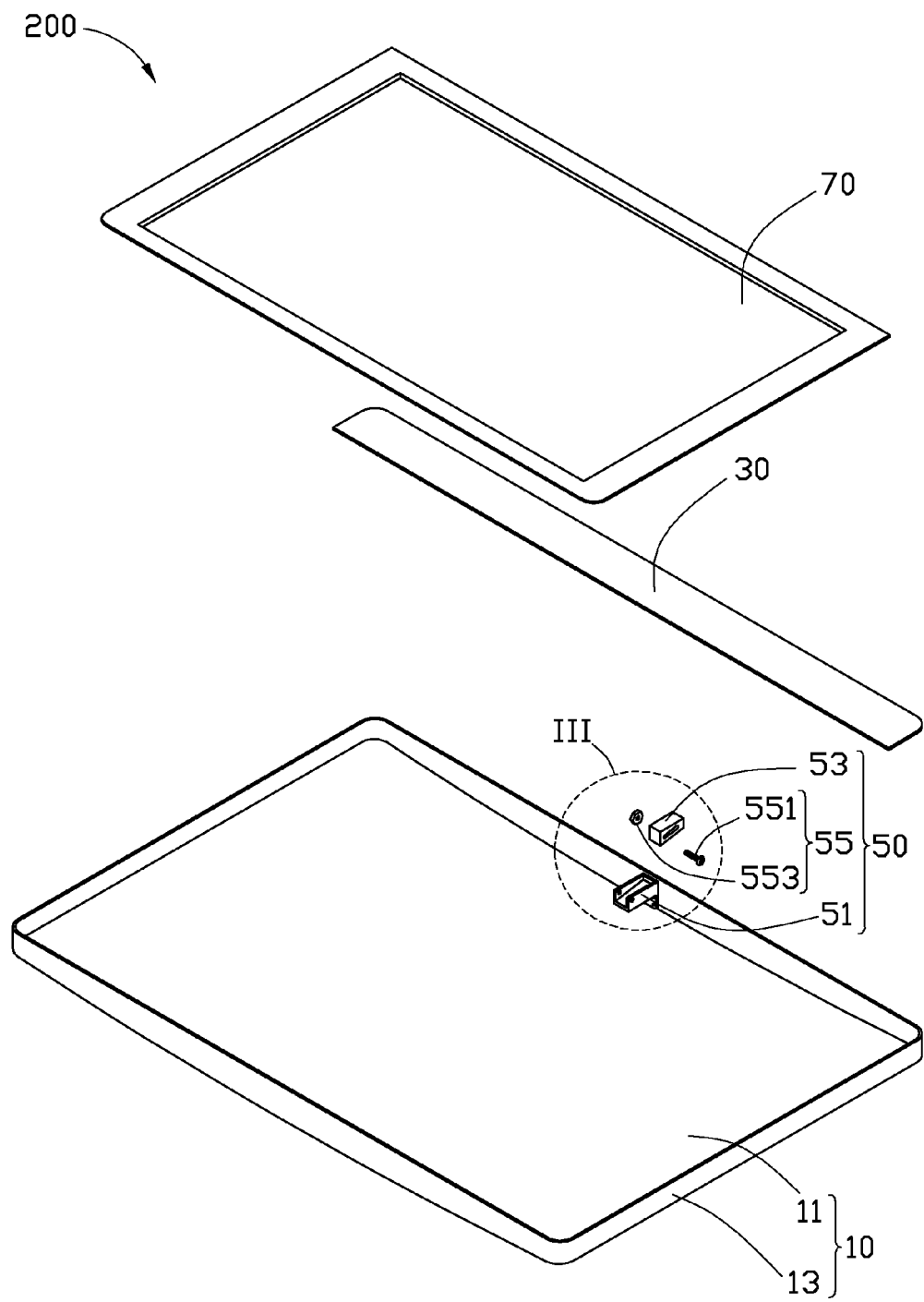
FIG. 2 is an exploded, isometric view of the electronic device of FIG. 1, showing a support mechanism.

Referring to FIGS. 1 and 2, the disclosed electronic device frame 100 is applied in a display body 70 of an electronic device 200, with the display body 70 fixed to the frame 100. The frame 100 includes a housing 10, a positioning member 30, and one or more inner support mechanisms 50. The support mechanism 50 is positioned between the housing 10 and the positioning member 30. The display body 70 is positioned on the housing 10, and connected to the positioning member 30. In the illustrated embodiment, the electronic device 200 is a flat panel display, and the frame 100 is part of the flat panel display 200 and has one inner support mechanism 50.

The housing 10 includes a base plate 11 and a sidewall 13 extending from an edge of the base plate 11. The positioning member 30 can be welded to a top end of the sidewall 13.

Figure 3:
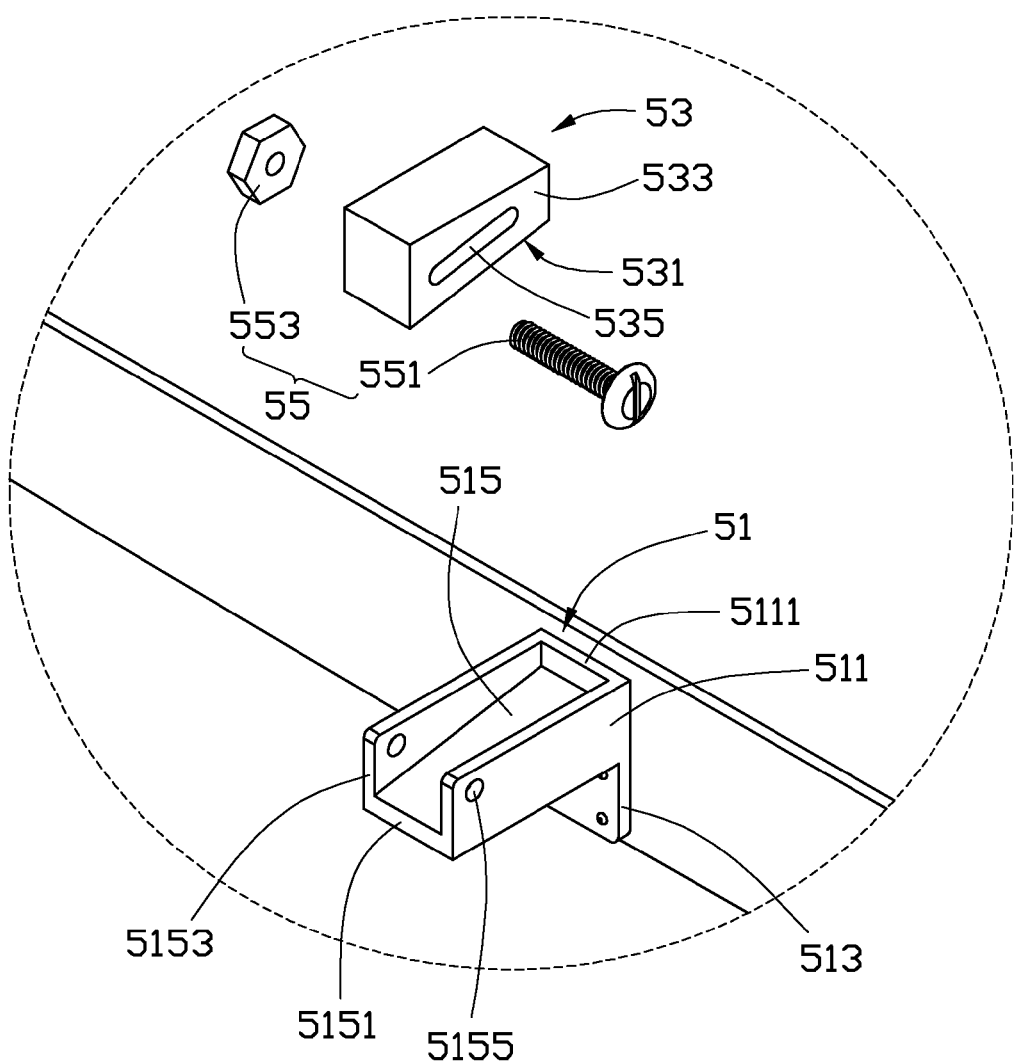
FIG. 3 is an enlarged view of part III of FIG. 2.
Figure 4:
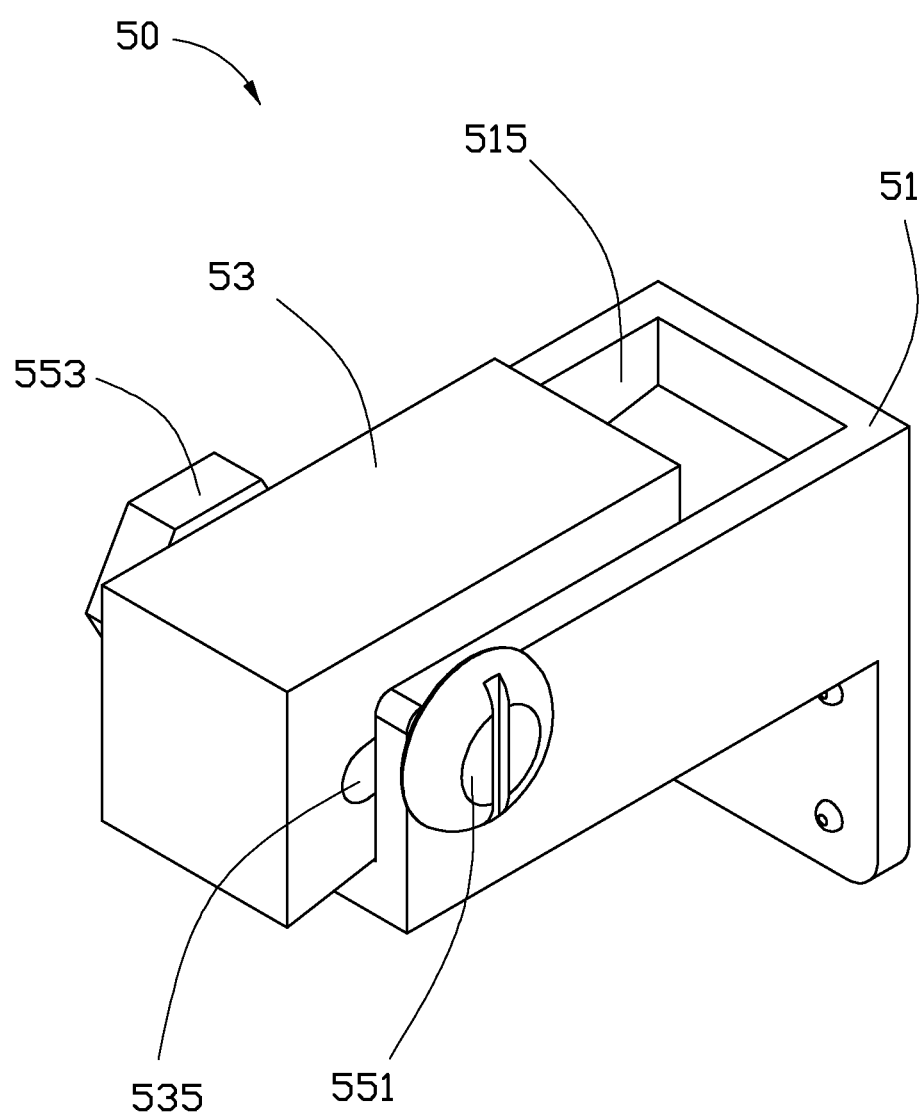
FIG. 4 is an isometric view of a support mechanism of FIG. 2.

Referring to FIGS. 2 to 4, the support mechanism 50, includes a support member 51, a slider 53, and a fastener 55. The slider 53 is partially received in the support member 51 and resists the positioning member 30. The fastener 55 connects the support member 51 to the slider 53.

The support member 51 includes a support body 511 and a connecting plate 513 extending from the edge of the support body 511. The support body 511 includes a first surface 5111 and defines a receiving portion 515 receiving the slider 53. The receiving portion 515 includes a base wall 5151 angled with the first surface 5111 and two sidewalls 5153 extending substantially perpendicular from opposite edges of the base wall 5151, and the base wall 5151 includes a slope (not labeled). Each of the sidewalls 5153 defines a fixing hole 5155, coaxial to each other. The support member 51 can be welded to the sidewall 13 of the housing 10. The support member 51 can also be connected to the housing 10 by gluing or fastening.

Figure 5:
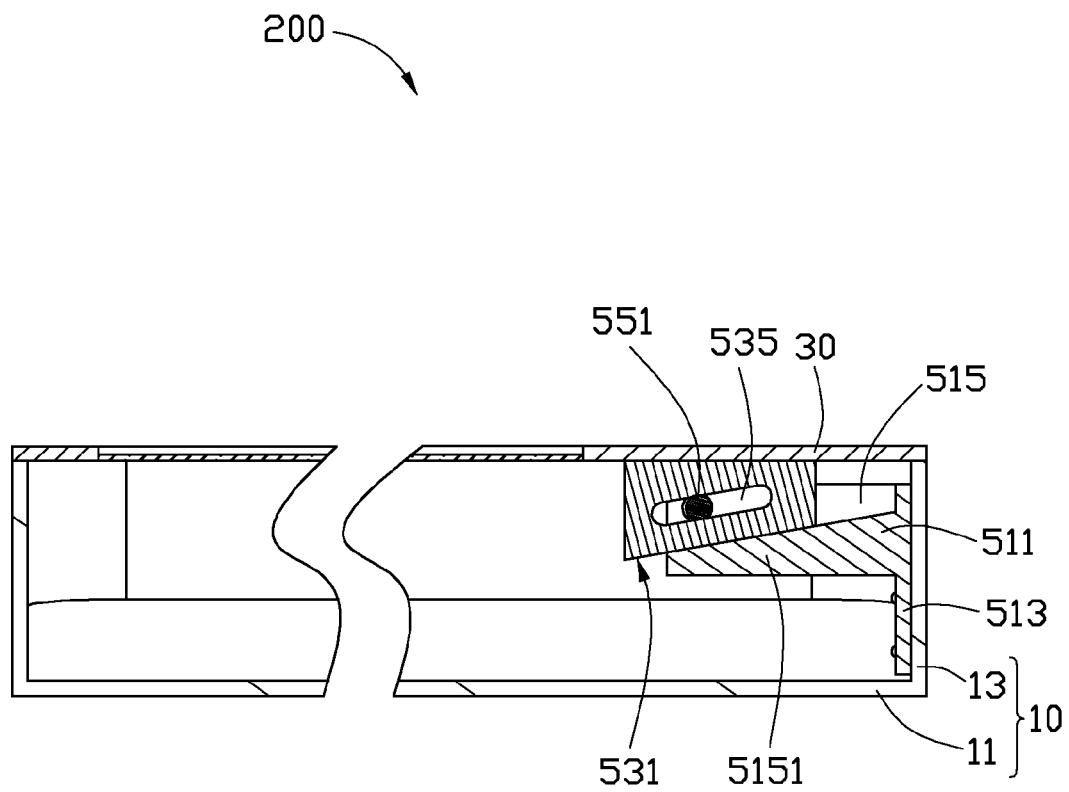
FIG. 5 is a cross-section of the electronic device of FIG. 1 taken along line V-V.

Referring to FIGS. 3 and 5, the slider 53 includes an inclined sliding surface 531 and a first end surface 533. The slider 53 defines a locking slot 535 extending through the first end surface 533 of the slider 53 to the opposite end surface (not shown). The locking slot 535 is substantially parallel to the inclined sliding surface 531. The slider 53 is retained in any position by the fastener 55 latching at different positions of the locking slot 535.

The fastener 55 includes a threaded fastener 551 engaging with a threaded fastener cap 553. The diameter of the threaded fastener 551 is substantially the same as the width of the locking slot 535 along an axis substantially perpendicular to the sliding surface 531, with friction generated between the threaded fastener 551 and the locking slot 535.

During assembly of the frame 100, the support member 51 can be welded to a middle portion of the sidewall 13. The slider 53 is positioned in the receiving portion 515 of the support member 51. The threaded fastener 551 extends through one fixing hole 5155 of a sidewall 5153 of the receiving portion 515, the locking slot 535 of the slider, and the another fixing hole 5155 of another sidewall of the receiving portion 515, and engages with the threaded fastener cap 553. The positioning member 30 can be welded to the top end of the sidewall 13 of the housing 10.

If there is clearance between the slider 53 and the positioning member 30, the fastener 55 can be removed to release the slider 53, so that the slider 53 can slide in the receiving portion 515. Once the slider 53 resists the positioning member 30, the slider 53 is fixed again by the fastener 55. The display body 70 is connected to the positioning member 30.

The support mechanism 50 includes the support member 51 and the slider 53 fastened thereto, resulting in a simplified structure. In addition, the sliding surface 531 of the slider 53 and the base wall 5151 of the support member 51 are angled with respect to the positioning member 30, and a distance between the slider 53 and the base plate 11 is adjustable such that the positioning member 30 is always firmly supported by the support mechanism 50.

It should be pointed out that the frame 100 may also include more than one support mechanism 50, arrayed on the base plate 11 appropriately.

The locking slot 535 may alternatively be defined in the support body 511, and a fixing hole in the slider 53 correspondingly to receive the threaded fastener 551.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. An electronic device frame, comprising: a housing comprising a base plate and a sidewall extending from an edge of the base plate; a positioning member fixed to the sidewall and parallel to the base plate; and an inner support mechanism comprising a support member, a slider, and a fastener connecting the slider to the support member, wherein the support member is fixed to the sidewall one of the housing the support member comprises a support body comprising a first surface and defining a receiving portion on the first surface to receive the slider, the receiving portion comprises a base wall angled with respect to the positioning member; the slider defines a locking slot latching the fastener; the slider comprises an inclined sliding surface parallel to the base wall and angled with respect to the positioning member, the locking slot is substantially parallel to the inclined sliding surface, and the slider maintains different positions on the support member by connection thereto to adjust a distance between the slider and the base plate.

2. The electronic device frame of claim 1, wherein the receiving portion further comprises two sidewalls, each sidewall extending from opposite edges of the base wall, between which the slider is received.

3. The electronic device frame of claim 2, wherein each sidewall defines a fixing hole; the fastener extends through the fixing hole of the support member and the locking slot of the slider and connects the slider to the support member.

4. The electronic device frame of claim 3, wherein the fastener comprises a threaded fastener and a threaded fastener cap; the threaded fastener extends through the fixing hole of the support member and the locking slot of the slider.

5. The electronic device frame of claim 4, wherein a diameter of the threaded fastener is substantially the same as a width of the locking slot along an axis substantially perpendicular to the sliding surface.

6. The electronic device frame of claim 1, wherein the support member is welded to the housing.

* * * * *